United States Patent
Wang et al.

(10) Patent No.: US 6,207,552 B1
(45) Date of Patent: Mar. 27, 2001

(54) FORMING AND FILLING A RECESS IN INTERCONNECT FOR ENCAPSULATION TO MINIMIZE ELECTROMIGRATION

(75) Inventors: Pin-Chin C. Wang, Menlo Park; Lu You, Santa Clara, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/495,843

(22) Filed: Feb. 1, 2000

(51) Int. Cl.$^7$ .................................................. H01L 21/4763
(52) U.S. Cl. .......................... 438/618; 438/611; 438/612
(58) Field of Search ..................................... 438/618, 611, 438/612

(56) References Cited

U.S. PATENT DOCUMENTS 5,824,599 * 10/1998 Schacham-Diamand et al. .
6,096,648 * 8/2000 Lopatin et al. .

* cited by examiner

Primary Examiner—Kevin M. Picardat
Assistant Examiner—D. M. Collins
(74) Attorney, Agent, or Firm—Monica H. Choi

(57) ABSTRACT

A strong interface is fabricated by forming and filling a recess on top of an interconnect between the interconnect and an encapsulating layer to prevent the lateral drift of material from the interconnect along the bottom of the encapsulating layer. A recess is formed within the top surface of the interconnect, and diffusion barrier material is deposited within the recess on the top surface of the interconnect. The diffusion barrier material may be epitaxially grown from the interconnect during the deposition of the diffusion barrier material within the recess to promote adhesion of the diffusion barrier material to the interconnect. An encapsulating layer is deposited on top of the diffusion barrier material. The diffusion barrier material and the encapsulating layer are comprised of a similar chemical element to promote adhesion of the diffusion barrier material to the encapsulating layer. The diffusion barrier material within the recess of the interconnect prevents lateral drift of material comprising the interconnect along the encapsulating layer. When the layer of encapsulating dielectric is comprised of silicon nitride, a nitrided surface may be formed on top of the diffusion barrier material by exposing the top of the diffusion barrier material to nitrogen plasma before depositing the encapsulating layer of silicon nitride on top of the diffusion barrier material. The present invention may be used to particular advantage when the interconnect is a copper interconnect and when the layer of encapsulating layer is comprised of silicon nitride.

12 Claims, 4 Drawing Sheets

FORMING AND FILLING A RECESS IN INTERCONNECT FOR ENCAPSULATION TO MINIMIZE ELECTROMIGRATION

TECHNICAL FIELD

The present invention relates generally to fabrication of integrated circuits, and more particularly, to forming and filling a recess in an interconnect, such as copper interconnect for example, with a diffusion barrier material to effectively encapsulate the interconnect for preventing material comprising the interconnect from laterally drifting into surrounding insulating material.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Thus far, aluminum has been prevalently used for metallization within integrated circuits. However, as the width of metal lines are scaled down to smaller submicron and even nanometer dimensions, aluminum metallization shows electromigration failure. Electromigration failure, which may lead to open and shorted metal lines, is now a commonly recognized problem. Moreover, as dimensions of metal lines further decrease, metal line resistance increases substantially, and this increase in line resistance may adversely affect circuit performance.

Given the concerns of electromigration and line resistance with smaller metal lines and vias, copper is considered a more viable metal for smaller metallization dimensions. Copper has lower bulk resistivity and potentially higher electromigration tolerance than aluminum. Both the lower bulk resistivity and the higher electromigration tolerance improve circuit performance.

Referring to FIG. 1, a cross sectional view is shown of a copper interconnect 102 within a trench 104 formed in an insulating layer 106. The copper interconnect 102 within the insulating layer 106 is formed on a semiconductor substrate 108 such as a silicon substrate as part of an integrated circuit. Because copper is not a volatile metal, copper cannot be easily etched away in a deposition and etching process as typically used for aluminum metallization. Thus, the copper interconnect 102 is typically formed by etching the trench 104 as an opening within the insulating layer 106, and the trench 104 is then filled with copper typically by an electroplating process, as known to one of ordinary skill in the art of integrated circuit fabrication.

Unfortunately, copper is a mid-bandgap impurity in silicon and silicon dioxide. Thus, copper may diffuse easily into these common integrated circuit materials. Referring to FIG. 1, the insulating layer 106 is typically comprised of silicon dioxide. Copper may easily diffuse into the insulating layer 106, and this diffusion of copper may degrade the performance of the integrated circuit. Thus, a diffusion barrier material 110 is deposited to surround the copper interconnect 102 within the insulating layer 106 on the sidewalls and the bottom wall of the copper interconnect 102, as known to one of ordinary skill in the art of integrated circuit fabrication. The diffusion barrier material 110 is disposed between the copper interconnect 102 and the insulating layer 106 for preventing diffusion of copper from the copper interconnect 102 to the insulating layer 106 to preserve the integrity of the insulating layer 106.

Further referring to FIG. 1, an encapsulating layer 112 is deposited as a passivation layer to encapsulate the copper interconnect 102, as known to one of ordinary skill in the art of integrated circuit fabrication. The encapsulating layer 112 is typically comprised of a dielectric such as silicon nitride, and copper from the copper interconnect 102 does not easily diffuse into such a dielectric of the encapsulating layer 112.

Referring to FIG. 1, in the prior art, the encapsulating layer 112 of silicon nitride is deposited directly onto an exposed surface of the copper interconnect 102 and the surrounding insulating layer 106 after the exposed surface of the copper interconnect 102 and the surrounding insulating layer 106 are polished to a level surface. Unfortunately, the silicon nitride of the encapsulating layer 112 does not bond well to the copper at the exposed surface of the copper interconnect 102. Thus, although copper does not diffuse easily through the encapsulating layer 112 of silicon nitride, copper from the copper interconnect 102 laterally drifts from the interface between the copper interconnect 102 and the encapsulating layer 112 of silicon nitride along the bottom surface 114 of the encapsulating layer 112 of silicon nitride because of the weak bonding of the copper interconnect 102 and the encapsulating layer 112 of silicon nitride.

The copper that laterally drifts from the interface between the copper interconnect 102 and the encapsulating layer 112 of silicon nitride along the bottom surface 114 of the encapsulating layer 112 diffuses into the insulating layer 106 of silicon dioxide to disadvantageously degrade the insulating property of the insulating layer 106. Nevertheless, use of copper metallization is desirable for further scaling down integrated circuit dimensions because of the lower bulk resistivity and the higher electromigration tolerance. Thus, a strong interface is desired between the copper interconnect 102 and the encapsulating layer 112 of silicon nitride to prevent the lateral drift of copper from the copper interconnect 102 along the bottom 114 of the encapsulating layer 112 into the insulating layer 106.

SUMMARY OF THE INVENTION

Accordingly, in a general aspect of the present invention, a strong interface is fabricated by forming and filling a recess on top of an interconnect between the interconnect and an encapsulating layer to prevent the lateral drift of material from the interconnect along the bottom of the encapsulating layer.

In one embodiment of the present invention, a recess is formed within the top surface of the interconnect. A diffusion barrier material is deposited within the recess on the top surface of the interconnect. The diffusion barrier material may be epitaxially grown from the interconnect during the deposition of the diffusion barrier material within the recess to promote adhesion of the diffusion barrier material to the interconnect. An encapsulating layer is deposited on top of the diffusion barrier material. The diffusion barrier material and the encapsulating layer are comprised of a similar chemical element to promote adhesion of the diffusion barrier material to the encapsulating layer. The diffusion barrier material within the recess of the interconnect prevents lateral drift of material comprising the interconnect along the encapsulating layer.

In one aspect of the present invention, when the layer of encapsulating dielectric is comprised of silicon nitride, a nitrided surface is formed on top of the diffusion barrier material by exposing the top of the diffusion barrier material to nitrogen plasma before depositing the encapsulating layer of silicon nitride on top of the diffusion barrier material.

In another aspect of the present invention, the recess on the top surface of the interconnect is formed by a "dishing effect" and/or an "erosion effect" during a CMP (Chemical Mechanical Polishing) of the interconnect.

The present invention may be used to particular advantage when the interconnect is a copper interconnect and when the layer of encapsulating layer is comprised of silicon nitride.

The diffusion barrier material within the recess of the interconnect adheres to the interconnect and to the layer of encapsulating layer with a strong bond to form a strong interface between the interconnect and the encapsulating layer for preventing lateral drift of material from the interconnect along the bottom of the encapsulating layer.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, and 10 refer to elements having similar structure and function.

DETAILED DESCRIPTION

Figure 1:
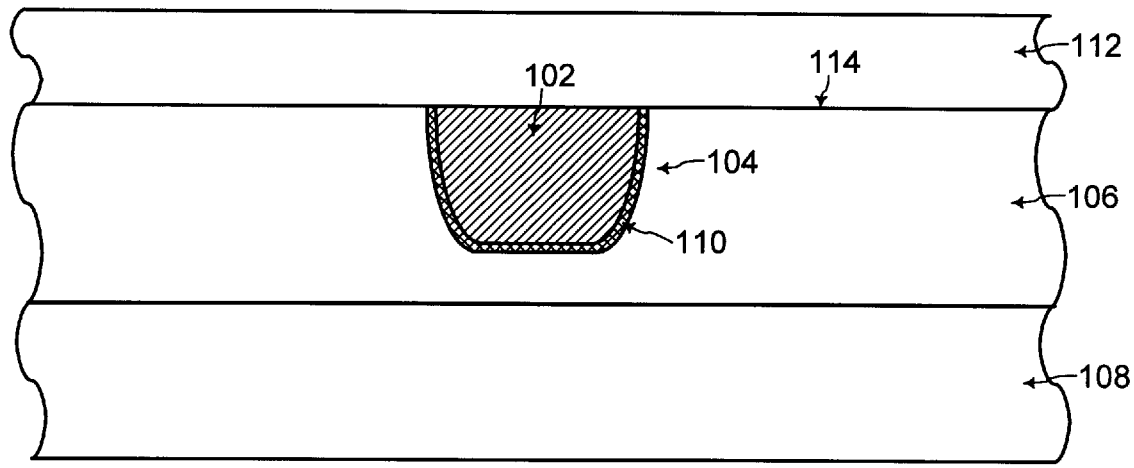
FIG. 1 shows a cross-sectional view of a copper interconnect formed by copper filling a trench within an insulating layer, according to the prior art.
Figure 2:
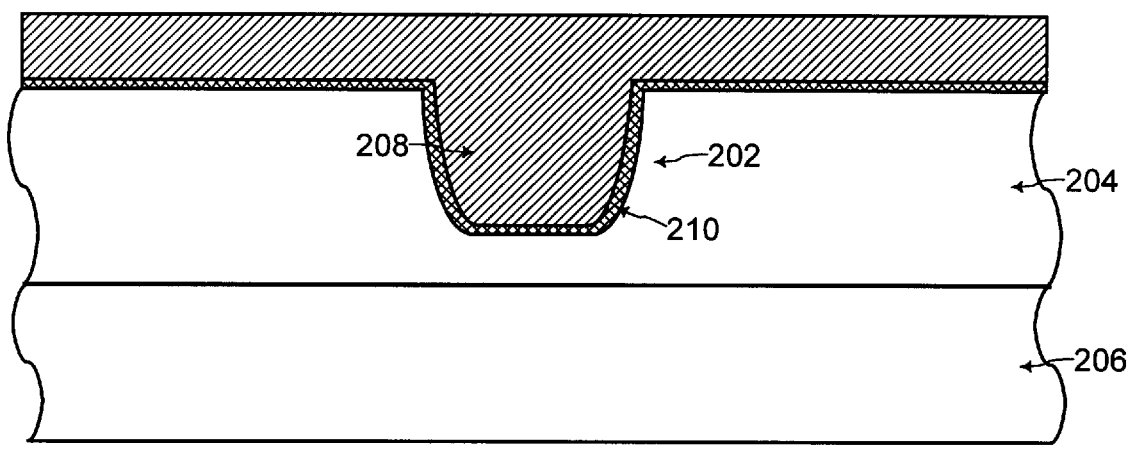
FIGS. 2, 3, 4, 5, 6, 7, 8, 9, and 10 illustrate process steps for fabricating a strong interface between an interconnect and an encapsulating layer by forming and filling a recess within the interconnect with a diffusion barrier material for preventing lateral drift of material from the interconnect along the bottom of the encapsulating layer, according to an aspect of the present invention.

Referring to FIG. 2, for forming an interconnect such as copper interconnect, a trench 202 is formed within an insulating layer 204 on a semiconductor substrate 206 as part of an integrated circuit, as known to one of ordinary skill in the art of integrated circuit fabrication. Copper interconnect is desirable for metallization within an integrated circuit with scaled down dimensions because copper has lower bulk resistivity and potentially higher electromigration tolerance than aluminum. However, because copper is not a volatile metal, copper cannot be easily etched away in a deposition and etching process as typically used for aluminum metallization. Thus, copper interconnect is typically formed by etching the trench 202 as an opening within the insulating layer 204. Referring to FIG. 2, the trench 202 is then filled with copper typically by an electroplating process to form a copper interconnect 208, as known to one of ordinary skill in the art of integrated circuit fabrication.

Further referring to FIG. 2, typically before filling the trench 202 with copper to form the copper interconnect 208, a first diffusion barrier material 210 is deposited within the trench 202 to prevent diffusion of copper from the copper interconnect 208 into the surrounding insulating layer 204. Unfortunately, copper is a mid-bandgap impurity in silicon and silicon dioxide. Thus, copper may diffuse easily into these common integrated circuit materials. Referring to FIG. 2, the insulating layer 204 is typically comprised of silicon dioxide especially when the semiconductor substrate 206 is a silicon substrate.

Copper may easily diffuse into the insulating layer 204, and the diffusion of copper may degrade the performance of the integrated circuit. Thus, the first diffusion barrier material 210 is deposited to surround the copper interconnect 208 within the insulating layer 204 on the sidewalls and the bottom wall of the copper interconnect 208, as known to one of ordinary skill in the art of integrated circuit fabrication. The diffusion barrier material 210 is disposed between the copper interconnect 208 and the insulating layer 204 for preventing diffusion of copper from the copper interconnect 208 to the insulating layer 204 to preserve the integrity of the insulating layer 204.

Figure 3:
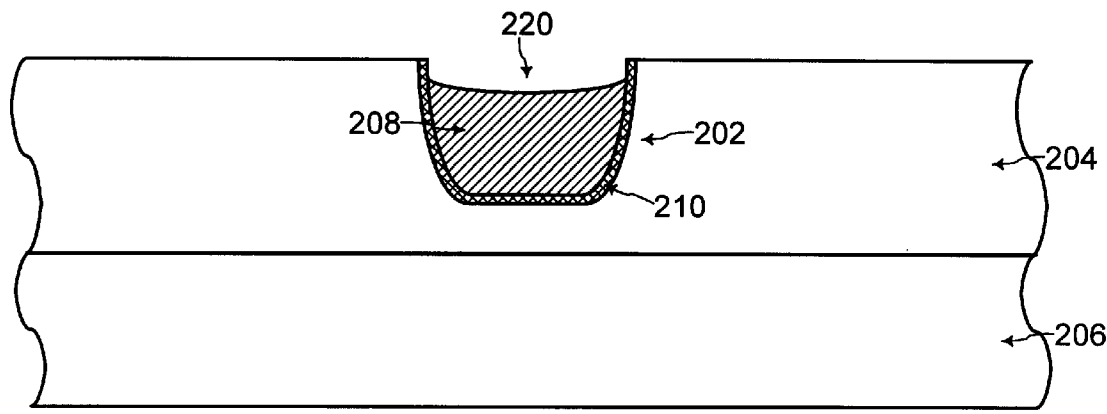

Referring to FIG. 2, during deposition of the first diffusion barrier material 210 and the copper into the trench 202, such materials are also deposited on top of the insulating layer 204. Referring to FIG. 3, after deposition of the first diffusion barrier material 210 and the copper for forming the copper interconnect 208, the top surface of the structures formed on the semiconductor substrate 206 is polished typically using a CMP (Chemical Mechanical Polishing) process. In such a polishing process, the first diffusion barrier material 210 and the copper deposited on the insulating layer 204 are polished away such that the first diffusion barrier material 210 and the copper are confined within the trench 202 for forming the copper interconnect 208. CMP processes are known to one of ordinary skill in the art of integrated circuit fabrication.

Referring to FIG. 3, according to an aspect of the present invention, during the CMP process for polishing away the first diffusion barrier material 210 and the copper from the insulating layer 204, parameters of the CMP process are adjusted such that a recess 220 is formed on the top surface of the copper interconnect 208. The recess 220 is formed on the top surface of the copper interconnect 208 according to the "dishing effect" and/or the "erosion effect" during a CMP process, as known to one of ordinary skill in the art of integrated circuit fabrication.

Parameters of the CMP process such as the roughness of the polishing pad may be controlled to affect the formation of the recess 220 on the top surface of the copper interconnect 208, as known to one of ordinary skill in the art of integrated circuit fabrication. The depth of the recess 220 is also determined by the width of the interconnect 208 with the "dishing effect" and/or the "erosion effect," as known to one of ordinary skill in the art of integrated circuit fabrication. Typically, the "dishing effect" and/or the "erosion effect" and the formation of a recess on an interconnect are avoided in the prior art, but in an aspect of the present invention, parameters of the CMP are intentionally controlled for formation of the recess 220 on the top surface of the copper interconnect 208.

Figure 4:
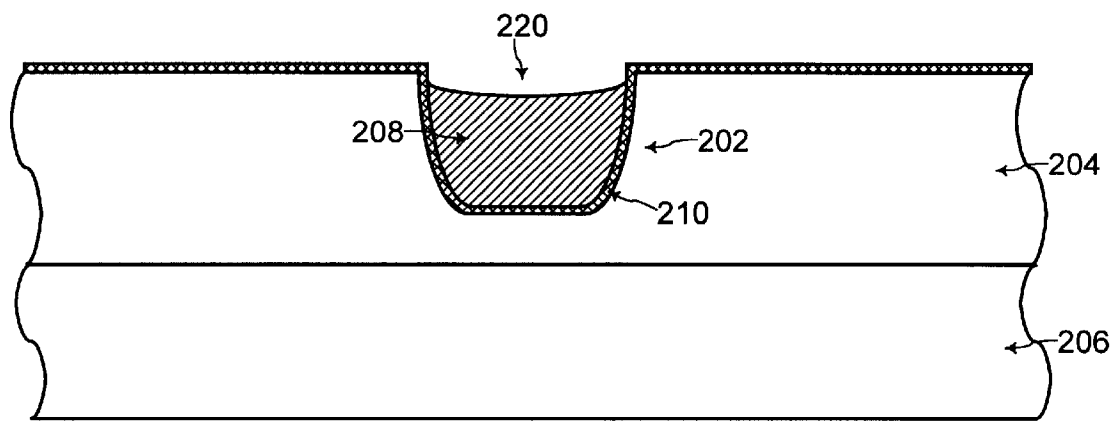

Referring to FIG. 4, in another embodiment of the present invention, after the CMP process for polishing away the copper deposited on the insulating layer 204, the first diffusion barrier material 210 may remain on the insulating layer 204 as illustrated in FIG. 4. In that case, referring to FIG. 5, a selective sputtering process is used to etch away the remaining first diffusion barrier material 210 away from the insulating layer 204. Such a sputtering process also selectively etches away some copper from the top surface of the copper interconnect 208 such that the depth of the recess 220 on the top surface of the copper interconnect 208 is enhanced. The present invention may be practiced with or without this selective sputtering process, as would be apparent to one of ordinary skill in the art of integrated circuit fabrication from the description herein.

Figure 5:
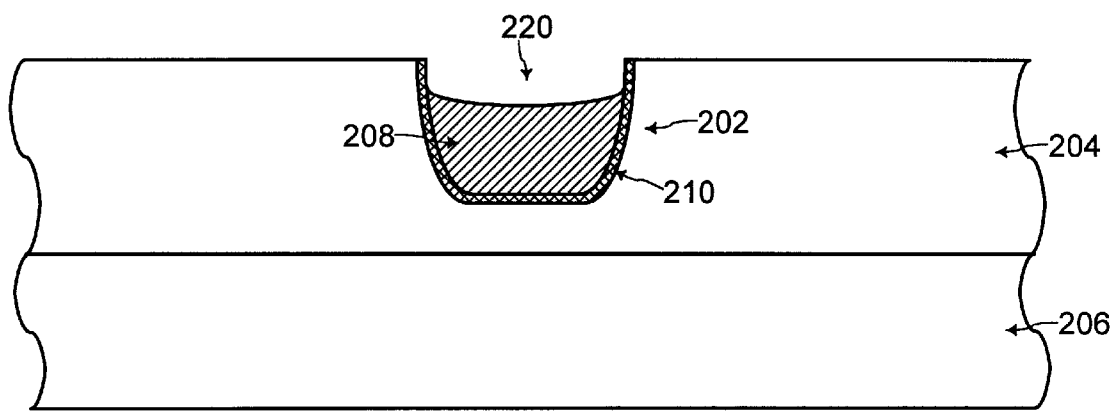
Figure 6:
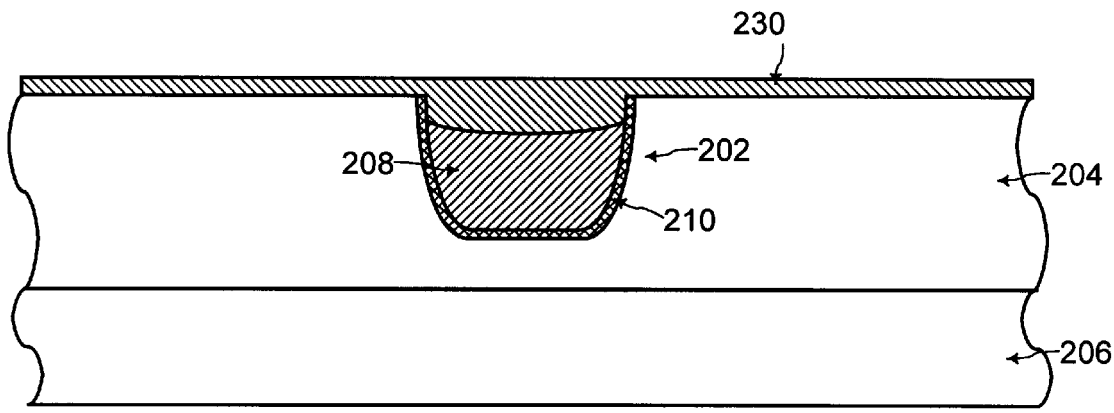

Referring to FIGS. 3, 5, and 6, after formation of the recess 220 on the top surface of the copper interconnect 208, a second diffusion barrier material 230 is deposited into the recess 220. The second diffusion barrier material 230 may be the same as or may be different from the first diffusion barrier material 210 surrounding the copper interconnect 208 within the insulating layer 204.

In addition, the present invention may be practiced with any other integrated circuit fabrication processes for formation of a recess on the interconnect 208 such as any combination of selective etching, selective sputtering, or CMP (Chemical Mechanical Polishing) processes, as would be apparent to one of ordinary skill in the art of integrated circuit fabrication from the description herein.

In one embodiment of the present invention, the second diffusion barrier material 230 filling the recess 220 may be epitaxially grown from the exposed top surface of the copper interconnect 208 to promote adhesion of the second diffusion barrier material 230 to the copper interconnect 208. Processes for epitaxially growing diffusion barrier material from an interconnect such as the copper interconnect 208 are known to one of ordinary skill in the art of integrated circuit fabrication. For example, the present invention may be used to particular advantage when the second diffusion barrier material 230 comprised of tantalum is epitaxially grown from the interconnect 208 comprised of copper.

Figure 7:
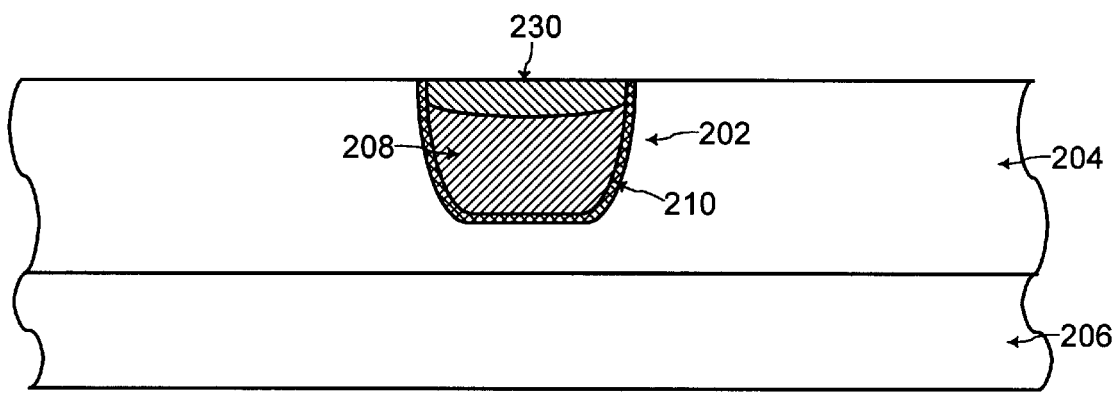

Referring to FIG. 6, the second diffusion barrier material 230 filling the recess 220 is also deposited onto the insulating layer 204. Referring to FIG. 7, the top surfaces of the structures on the semiconductor substrate 206 are polished such that the second diffusion barrier material 230 is confined to be within the recess 220 typically using a CMP (Chemical Mechanical Polishing) process. In this case, parameters of such a CMP process are controlled to minimize the "dishing effect" and/or the "erosion effect" such that the second diffusion barrier material 230 remains within the recess 220.

Figure 8:
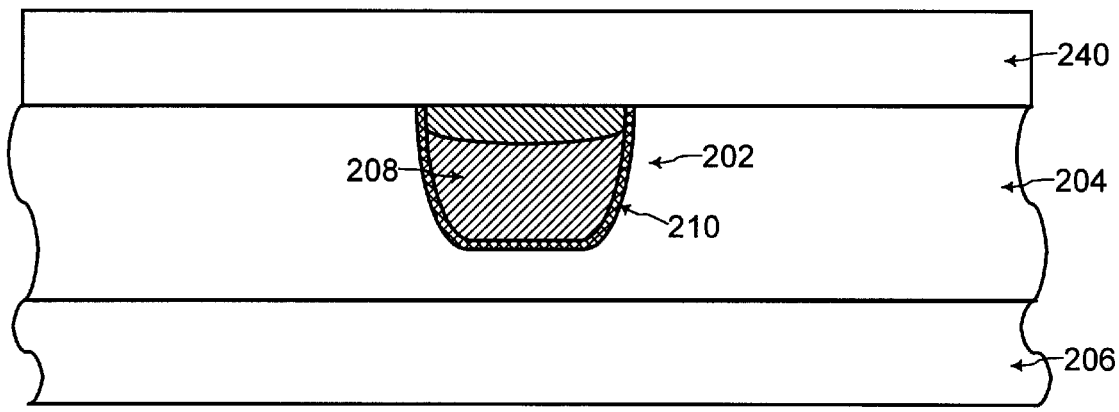

Referring to FIG. 8, an encapsulating layer 240 is deposited on top of the second diffusion barrier material 230 filling the recess 220 and on top of the insulating layer 204. In an aspect of the present invention, the second diffusion barrier material 230 and the encapsulating layer 240 are comprised of a similar chemical element to promote adhesion of the second diffusion barrier material 230 to the encapsulating layer 240. For example, the encapsulating layer 240 is typically comprised of silicon nitride. In that case, for the copper interconnect 208, the second diffusion barrier material 230 may be comprised of titanium nitride (TiN) or tantalum nitride (TaN). Thus, the second diffusion barrier material 230 and the encapsulating layer 240 are both comprised of nitrogen to promote adhesion of the second diffusion barrier material 230 to the encapsulating layer 240.

In this manner, by forming the diffusion barrier material 230 between the copper interconnect 208 and the encapsulating layer 240 and by promoting the adhesion of the diffusion barrier material 230 to the copper interconnect 208 and the encapsulating layer 240, a strong interface is created between the copper interconnect 208 and the encapsulating layer 240. With such a strong interface, lateral drift of copper from the copper interconnect 208 along the bottom 242 of the encapsulating layer 240 is minimized. With such minimization of the lateral drift of copper from the copper interconnect 208 along the bottom 242 of the encapsulating layer 240, contamination of the insulating layer 204 with copper is minimized such that the integrity of the insulating layer 204 is preserved.

Figure 9:
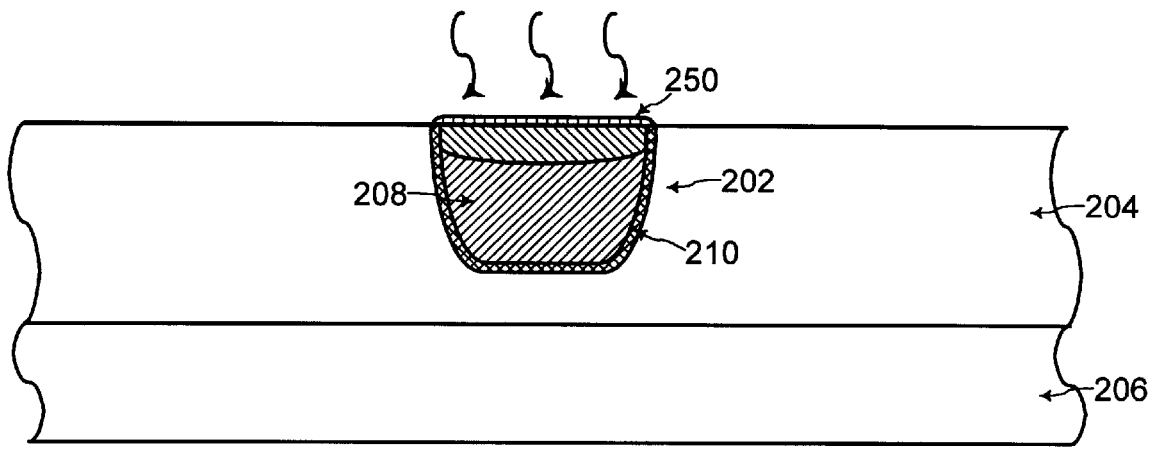

Referring to FIG. 9, for further promoting the adhesion of the encapsulating layer 240 of silicon nitride to the top surface of the second diffusion barrier material 230 within the recess 220, the top surface of the second diffusion barrier material 230 is exposed to a nitrogen plasma for formation of a nitrided surface 250 on the top surface of the second diffusion barrier material 230 before deposition of the encapsulating layer 240. Processes for formation of the nitrided surface 250 from such nitrogen plasma are known to one of ordinary skill in the art of integrated circuit fabrication.

Figure 10:
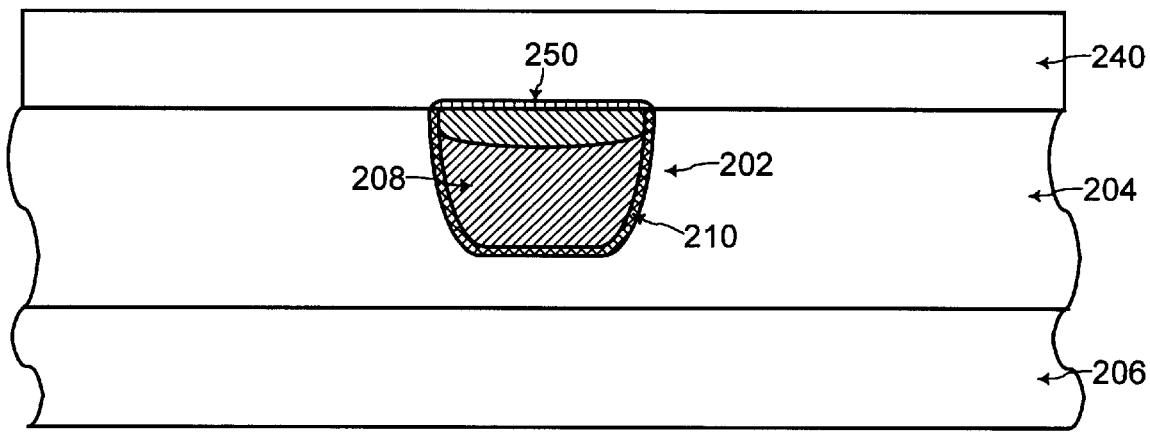

Referring to FIG. 10, the encapsulating layer 240 is deposited after formation of the nitrided surface 250 on the top surface of the second diffusion barrier material 230. The nitrogen rich nitrided surface 250 further promotes the bonding of the encapsulating layer 240 of silicon nitride to the top surface of the second diffusion barrier material 230 to further enhance the strong interface between the copper interconnect 208 and the encapsulating layer 240 such that lateral drift of copper from the copper interconnect 208 along the bottom 242 of the encapsulating layer 240 is further minimized.

Furthermore, the formation of the nitrided surface 250 may be advantageously used for promoting the adhesion of the encapsulating layer 240 of silicon nitride to the second diffusion barrier material 230 when the second diffusion barrier material 230 is not comprised of nitrogen. For example, for the copper interconnect 208, the second diffusion barrier material 230 may be a selected one of titanium (Ti), tantalum (Ta), or tungsten (W). In that case, the nitrided surface 250 is formed to provide nitrogen on the surface of the second diffusion barrier material 230 to promote the adhesion of the encapsulating layer 240 of silicon nitride to the second diffusion barrier material 230.

The foregoing is by way of example only and is not intended to be limiting. For example, the present invention may be used for effectively encapsulating any type of interconnect comprising a material that easily drifts laterally along the bottom of the encapsulating layer, aside from just the example of a copper interconnect, as would be apparent to one of ordinary skill in the art of integrated circuit fabrication from the description herein.

Furthermore, as will be understood by those skilled in the art, the structures described herein may be made or used in the same way regardless of their position and orientation. Accordingly, it is to be understood that terms and phrases such as "top," "bottom," "sidewalls," and "depth" as used herein refer to relative location and orientation of various portions of the structures with respect to one another, and are not intended to suggest that any particular absolute orientation with respect to external objects is necessary or required. In addition, any materials mentioned herein are by way of example only.

The present invention is limited only as defined in the following claims and equivalents thereof.

We claim:

1. A method for encapsulating a top surface of an interconnect of an integrated circuit, said interconnect being within an insulating layer, the method including the steps of:

A. forming a recess within said top surface of said interconnect;

B. depositing a diffusion barrier material within said recess on said top surface of said interconnect; and C. depositing an encapsulating layer on top of said diffusion barrier material, wherein said diffusion barrier material and said encapsulating layer are comprised of a similar chemical element to promote adhesion of said diffusion barrier material to said encapsulating layer;

and wherein said diffusion barrier material prevents lateral drift of material comprising said interconnect along said encapsulating layer.

2. The method of claim 1, wherein said diffusion barrier material is epitaxially grown from said interconnect during said deposition of said diffusion barrier material within said recess to promote adhesion of said diffusion barrier material to said interconnect.

3. The method of claim 1, wherein said interconnect is surrounded by said diffusion barrier material on sidewalls and bottom of said interconnect within said insulating layer.

4. The method of claim 1, wherein said interconnect is copper interconnect, and wherein said diffusion barrier material is a selected one of tantalum nitride (TaN), titanium nitride (TiN), and tungsten nitride (WN), and wherein said encapsulating layer is comprised of silicon nitride.

5. The method of claim 4, further including the step of:
forming a nitrided surface on said top of said diffusion barrier material by exposing said top of said diffusion barrier material to nitrogen plasma before depositing said encapsulating layer of silicon nitride on said top of said diffusion barrier material.

6. The method of claim 1, wherein said interconnect is copper interconnect, and wherein said diffusion barrier material is a selected one of tantalum (Ta), tungsten (W), and titanium (Ti), and wherein said encapsulating layer is comprised of silicon nitride, and wherein said method further includes the step of:
forming a nitrided surface on said top of said diffusion barrier material by exposing said top of said diffusion barrier material to nitrogen plasma before depositing said encapsulating layer of silicon nitride on said top of said diffusion barrier material.

7. The method of claim 1, wherein said insulating layer surrounding said interconnect is comprised of silicon dioxide.

8. The method of claim 1, wherein said recess of said interconnect is formed during a CMP (Chemical Mechanical Polishing) of said interconnect.

9. The method of claim 8, wherein said recess of said interconnect is further enhanced during selective sputtering of said interconnect.

10. The method of claim 1, wherein said recess of said interconnect is formed during selective etching of said interconnect.

11. The method of claim 1, wherein said step B further includes the steps of:
depositing a layer of said diffusion barrier material on top of said interconnect and on top of said insulating layer surrounding said interconnect; and
polishing away said layer of said diffusion barrier material with a CMP (Chemical Mechanical Polishing) process from said insulating layer surrounding said interconnect such that said diffusion barrier material is confined within said recess of said interconnect.

12. A method for encapsulating a top surface of copper interconnect of an integrated circuit, said copper interconnect being within an insulating layer of silicon dioxide, the method including the steps of:
A. forming a recess within said top surface of said copper interconnect during a CMP (Chemical Mechanical Polishing) process of said copper interconnect;
B. enhancing a depth of said recess within said top surface of said copper interconnect by selectively sputtering said copper interconnect;
C. depositing a diffusion barrier material within said recess on said top surface of said copper interconnect, wherein said diffusion barrier material is grown from said copper interconnect during said deposition of said diffusion barrier material within said recess to promote adhesion of said diffusion barrier material to said copper interconnect, and wherein said diffusion barrier material is a selected one of tantalum (Ta), titanium (Ti), tungsten (W), tantalum nitride (TaN), titanium nitride (TiN), and tungsten nitride (WN), and wherein said step C further includes the steps of:
depositing a layer of said diffusion barrier material on said top of said copper interconnect and on top of said insulating layer of silicon dioxide surrounding said copper interconnect; and
polishing away said layer of said diffusion barrier material with a CMP (Chemical Mechanical Polishing) process from said insulating layer of silicon dioxide surrounding said copper interconnect such that said diffusion barrier material is confined within said recess of said copper interconnect;
D. forming a nitrided surface on top of said diffusion barrier material by exposing said top of said diffusion barrier material to nitrogen plasma; and
E. depositing an encapsulating layer of silicon nitride on said top of said diffusion barrier material, wherein said nitrided surface on said top of said diffusion barrier material promotes adhesion of said diffusion barrier material to said encapsulating layer of silicon nitride;
and wherein said diffusion barrier material prevents lateral drift of copper along said encapsulating layer of silicon nitride;
and wherein said copper interconnect is surrounded by said diffusion barrier material on sidewalls and bottom of said copper interconnect within said insulating layer.

* * * * *